United States Patent
Kubiak et al.

[11] Patent Number: 5,902,185
[45] Date of Patent: May 11, 1999

[54] MAGNETIC TRANSMISSION COUPLINGS

[76] Inventors: Richard Andrej Kubiak, Bwthyn Cadwen, Pen-y-cae mawr, Usk, Gwent, NP5 1NA; Paul Richard Stonestreet, Collingwood Rise, Heathfield, Sussex, TN21 8DL, both of United Kingdom

[21] Appl. No.: 08/849,853
[22] PCT Filed: Oct. 17, 1996
[86] PCT No.: PCT/GB96/02558
    § 371 Date: Jun. 13, 1997
    § 102(e) Date: Jun. 13, 1997
[87] PCT Pub. No.: WO97/15110
    PCT Pub. Date: Apr. 24, 1997

[30] Foreign Application Priority Data

Oct. 17, 1995 [GB] United Kingdom .................... 9521237
Jun. 7, 1996 [GB] United Kingdom .................... 9611937

[51] Int. Cl.⁶ .......................... H02K 49/10; H01L 21/00
[52] U.S. Cl. ................. 464/29; 192/56.4; 310/75 D; 310/103
[58] Field of Search ................ 464/29; 310/103, 310/104, 75 D; 192/84.3, 54.4, 56.4

[56] References Cited

U.S. PATENT DOCUMENTS

| | | | |
|---|---|---|---|
| 4,277,707 | 7/1981 | Silver et al. | 310/104 |
| 4,752,194 | 6/1988 | Wienen et al. | 464/29 X |
| 4,896,064 | 1/1990 | Taiani | 310/104 |
| 5,013,949 | 5/1991 | Mabe | 310/103 X |
| 5,017,102 | 5/1991 | Shimaguchi et al. | |
| 5,204,572 | 4/1993 | Ferreira | 310/75 D X |
| 5,376,862 | 12/1994 | Stevens | 464/29 X |
| 5,514,925 | 5/1996 | Worthington et al. | 310/75 D X |
| 5,569,111 | 10/1996 | Cho et al. | 475/149 |
| 5,633,555 | 5/1997 | Ackermann et al. | 310/75 D |
| 5,763,973 | 6/1998 | Cramer | 310/103 |

FOREIGN PATENT DOCUMENTS

| | | |
|---|---|---|
| 37 19 973 | 12/1988 | Germany . |
| 2 165 592 | 4/1986 | United Kingdom . |
| 2 213 316 | 8/1989 | United Kingdom . |

OTHER PUBLICATIONS

P.C. Leenders, "Magnetische Tandwielen", *PT Elektronica–Elektrotechniek*, vol. 44, No. 10, Oct. 1, 1989, p. 46.

*Primary Examiner*—Rodney H. Bonck
*Attorney, Agent, or Firm*—Young & Thompson

[57] ABSTRACT

A magnetic transmission coupling includes an inner torque tube (62) carrying one or more stacks of annularly disposed spaced magnets (70), located within a sealing membrane element (38), and an outer, eccentric drive rotor (74) with a matching one or more stacks of annularly disposed spaced magnets (70). Rotary drive is transmitted across the membrane by rotating the drive rotor which causes the inner torque tube (62) to be driven. The torque tube (62) has an unusually large bore diameter through which an elongate stiff tube (52) may pass.

10 Claims, 3 Drawing Sheets

MAGNETIC TRANSMISSION COUPLINGS

This invention relates to magnetic transmission couplings for transmitting drive from one member to another, and in particular, but not exclusively, to rotary feedthrough transmission arrangements for use with a vacuum enclosure to allow transmission of rotation across a vacuum membrane and to allow access for services such as power, cooling, instrumentation, etc.

There are many manufacturing processes which require a workpiece to be treated in an enclosure in which the local environment is carefully controlled and isolated from ambient, typical examples including vacuum-based or gas-based processes. In such processes, the workpiece, for example a semiconductor wafer, an optical component, or a magnetic storage device may be subjected to a thin film deposition process, in which a material is sputtered, evaporated or injected as gas towards a heated substrate contained in a vacuum or other controlled atmosphere. It is often critical that the vacuum is at an extremely low pressure and/or kept isolated from atmosphere. Furthermore, this may require the process instrumentation to be of metal construction with the ability to withstand temperatures of typically 250° C. or more. In order to provide uniform thickness of the deposited films, the heated substrate pay need to be rotated at a predetermined substantially smooth speed. This requirement of transmitting rotation into the vacuum enclosure whilst maintaining the integrity of the vacuum enclosure has led to several designs of rotary feedthrough, an example being that described in British Patent GB 2213316. This is a concentric magnetic coupling arrangement, and drive is transmitted across a cylindrical wall of the enclosure to an inner magnetic array on a torque tube from an outer concentric magnetic array rotatably mounted on the cylindrical wall.

This arrangement has several disadvantages. With ongoing developments in processing techniques it is important to provide as large a diameter bore as possible down the middle of the feedthrough to provide sufficient access for power, cooling, thermocouple and other services and to allow stacking for co-axial rotation applications, and, in some instances, to allow transverse movement of elements within the bore. With the concentric arrangement of GB 2213316, the diameter of the bore or access port is limited in practice to less than the inner diameter of the outer magnetic array, because the cylindrical wall or membrane is typically of a welded construction and so must be small enough to allow the outer array to pass over it for assembly or servicing. Since it is vital to service the bearings which support the outer magnetic array, the concentric coupling must have an access port which is smaller than the inner diameter of the outer magnetic array. This is a major limitation for the concentric system especially considering that the magnets used are magnetised multiple magnets and therefore limited in size for reasonable cost.

A further disadvantage of the concentric arrangement is that it does not allow drive ratios of other than unity.

Furthermore, the concentric arrangement requires that the outer magnet array be mounted on large diameter bearings which run on the cylindrical wall or membrane of the coupling. Such large bearings are expensive and this is another factor which limits the diameter and thus applications of the arrangement.

A further feature of existing designs of rotary feedthrough is that drive member and the driven member comprise concentric co-operating annular drive members, in which each drive member is magnetised as a multiple magnet. These conventional magnetic couplings may be termed "static" couplings as, in normal use, the magnets do not move relative to each other, and thus they do not allow drive ratios of other than 1:1. The construction and magnetisation of the annuli requires machining of special grade ferromagnetic material and either a subsequent complex and lengthy magnetisation process, or provision of an electromagnet. In some cases preferred magnetisations cannot be achieved.

A need exists therefore for a transmission system which does not required complex machining or magnetisation steps.

We have found that it is possible to provide a non-concentric magnetic coupling in which the magnetic coupling effect applies across only a small portion of the circumference of the magnetic array or drive members, instead of around the whole 360° of the members in the concentric arrangement.

Accordingly, in one aspect, this invention provides a drive arrangement for transmitting rotary drive across a membrane element into a sealable enclosure, said drive arrangement comprising an internal member mounted for rotational movement about a first axis, an external member mounted for rotational movement about a second axis generally parallel to and spaced from said first axis, a membrane element disposed between said internal and external members, each of said internal and external drive members comprising a drive region in magnetic torque-transmitting relationship with the drive region on the other drive member.

Preferred arrangements allow drive to be transmitted relatively smoothly across a membrane at a variety of different drive ratios with low or negligible angular backlash. Furthermore the provision of a non-concentric drive removes a design constraint as it is no longer strictly essential to mount the inner magnetic drive member closely within a cylindrical membrane which itself is located concentrically within the outer drive member, provided there is sufficient magnetic coupling between the adjacent regions of the magnetic coupling members. Preferably the internal drive member is hollow, for example to allow a feedthrough device to extend therethrough.

The membrane may take any suitable shape passing between the internal and external drive members.

In the preferred aspect of the invention, the provision of the non-concentric drive means that the external drive member no longer limits the size of the access port through the membrane. Accordingly the membrane element may include or be connected to a flange member of diameter greater than that of the external drive member.

Preferably, the drive arrangement includes a connector flange means for being sealably attached to said enclosure and to said membrane element.

Where the internal drive member is of the preferred hollow configuration, the drive arrangement preferably includes an elongate relatively fixed member extending at least partially through said first member to project in use into said enclosure.

Preferably, at least one of said internal and external drive members is made up a series of discrete spaced magnets. Although fewer magnets may be used, it is preferred that each series comprises at least six and preferably eight magnets. A typical arrangement uses sixteen magnets for negligible angular backlash. For greater torque capability, the drive members may include two or more circumferential stacks of discretely spaced magnets. The magnets are preferably rare earth magnets.

In another aspect, this invention provides a drive arrangement comprising a connector member for being sealingly attached to a port or aperture in said enclosure, an elongate tubular element rotatably mounted with respect to said connector member, an elongate relatively fixed member disposed at least partially within said tubular element, a sealing membrane means connected to or forming part of said connector element and extending around said tubular element sealingly to isolate the interior of the enclosure from the exterior thereof, magnetic drive element associated with said tubular element and an external rotary drive member mounted for rotation outside said sealing membrane about an axis generally parallel to the axis of rotation of said tubular element, wherein the external drive member and the drive member associated with the elongate tubular element are in magnetic torque-transmitting relationship.

Although we initially designed an arrangement for application to specialist vacuum enclosures, the principles may be used more generally in a wide range of transmission systems.

Conventional toothed gear transmission systems are commonplace but have disadvantages in many applications. They normally require lubricants which can contaminate the environment in which they operate; they rely on mutual rolling contact between the teeth which induces friction and wear, thus again possibly leading to contamination by particulates. These problems can be particularly acute in, eg. the vacuum, semiconductor, nuclear and food industries, where the standards for cleanliness or contamination-free or particulate-free environments are extremely high.

Magnetic rotary couplings exist in which the drive member and the driven member comprise co-operating annular drive members, in which each drive member is magnetised as a multiple magnet. These conventional magnetic couplings may be termed "static" couplings as, in normal use, the magnets do not move relative to each other, and thus they do not allow drive ratios of other than 1:1. The construction and magnetisation of the annuli requires machining of special grade ferromagnetic material and either a subsequent lengthy magnetisation process, or provision of an electromagnet. For example GB 2240666A shows an arrangement disclosing a concentric arrangement in which the drive member and driven member each comprise a plurality of tangentially polarised magnets interposed between radially polarised magnets. This arrangement requires special machining and magnetisation and the magnets are contiguous rather than spaced.

GB 2284105 shows an arrangement in which a shaft is provided with a spiral track arrangement which allows drive to be transmitted in unison to a plurality of rollers. This arrangement requires complex formation of the spiral track arrangement and does not suggest the use of discrete magnets in a circular array.

GB 1579646 discloses a concentric arrangement in which drive is transmitted between two rotors which are made up of specially curved magnets butted up against each other. There is no suggestion of using standard rectangular sectioned magnets, nor of leaving a gap between adjacent magnets.

U.S. Pat. No. 5013949 discloses a transmission arrangement in which a planetary scheme is used to transmit rotation between two concentric shafts, with a pre-set drive ratio. This arrangement employs specially formed magnets of part-cylindrical section and there is no suggestion of using standard magnets of rectangular section. Furthermore, the planetary nature of the scheme renders it impractical where the drive and driven member are to be isolated by a membrane.

A need exists therefore for a transmission system which does not require complex machining or magnetisation steps and which ideally uses commonly available magnets.

Accordingly, in another aspect this invention provides a rotary transmission system, comprising a first member and a second member each having a drive region magnetically coupled to the drive region of the other member, whereby rotation of one member causes movement of the other member, wherein at least one of said drive regions comprises a generally circular array of discrete magnetic elements.

By this arrangement a highly effective magnetic transmission can be produced using discrete magnetic elements of rectangular cross section which are readily available and so production does not require complex machining or subsequent magnetisation of the drive or the provision of electromagnetic coils, etc. Through use of discrete magnets, a coupling can be constructed with far more poles than could be readily achieved using annular magnetised multi-pole members, resulting in significant advantages in terms of coupling torque and stiffness.

The term discrete magnetic elements does not preclude the possibility of the elements being "potted" in, e.g. a resin, or being otherwise integrated into the drive region.

Each drive member preferably comprises a generally circular array of spaced magnetic elements disposed between inner and outer keeper elements. The magnetic elements are preferably arranged with their pole axes radially disposed and of alternate polarity. Each drive member may typically comprise 4 to 24 magnets, but more may be used.

The relative disposition and orientation of the drive members may vary widely according to the required application. Thus, if the drive is to be co-linear, the first and second drive members may be concentric, rotating about a common axis. Alternatively, if rotational drive is to be transferred between two spaced parallel shaft members, they may rotate about spaced and generally parallel axes.

There is also a need for a transmission system which provides the possibility of transmitting drive to shafts which are not co-axial, and also of providing drive ratios of other than 1:1.

Accordingly, in another aspect, this invention provides a rotary transmission system including first and second members each having a driving region magnetically coupled to the drive region of the other drive member, whereby rotation of at least one of said members causes movement of the other member and relative movement of said driving regions with respect to each other.

Thus, these embodiments of the invention may exhibit "dynamic" coupling whereby there is relative movement between the drive member and the driven member. In contrast to conventional gear mechanisms, the invention allows drive to be transmitted across a wall or membrane, and, in contrast to co-axial magnetic couplings, the drive ratio may be other than 1:1. It will be appreciated that a disadvantage of conventional toothed gears is that friction between the gears leads to heat, which needs to be dissipated. In the embodiments of this invention, the drive is contactless and so no appreciable heat is generated by the interaction between the magnets.

The driving regions preferably comprise an arrangement of permanent magnets or magnetised regions.

The arrangements may take many different forms depending on the particular application. Thus if rotational drive is to be transferred between two spaced parallel shaft members, the driving regions may comprise on each shaft member a circumferentially disposed track of magnets or magnetised regions, which couples magnetically to an associated track on the other member. The pole axes of the magnets or magnetised regions are preferably generally radially disposed, with the magnets or magnetic regions being of alternate polarity.

The drive ratio between the two shaft members may be set by providing different even numbers of magnets on each shaft member. For example providing 20 magnets or magnetised regions on one shaft member and 12 on the other will provide a drive ratio of 5:3.

Alternatively, the drive shafts may be at an angle with respect to each other, in the same or parallel planes. Here the arrangement of the magnets or magnetised regions may be arranged as described above or set with their pole axes disposed on a generally conical surface.

In another arrangement, similar to a rack and pinion, one drive member may be mounted for rotation with the driving region thereof provided with a circumferential track of magnets or magnetised regions. The other member may be mounted for linear movement with the driving region thereof provided with a linear track of magnets or magnetised regions.

A transmission train may be set up with a series of members interconnected by drive regions and/or drive shafts to provide a particular drive ratio or to transmit the drive to a particular location. Also, a single input drive member may be coupled to two or more output drive members and vice versa.

In one embodiment, each drive region comprises a plurality of magnets, disposed generally concentrically with respect to the associated axes of rotation, with the pole axes disposed generally radially and adjacent magnets being spaced and of alternate polarity, and located by inner and outer keeper means.

In another aspect, this invention provides a rotary transmission including first and second rotatable members magnetically coupled, wherein the axes of rotation of said rotatable members are not co-axial.

Preferred arrangements of this invention do not require lubricants or coolants other than any lubricants required in the normal manner for shaft bearings etc. Compared to conventional gear systems, the preferred arrangements are contactless and so the "meshing" regions are wear-free and do not generate particulates or other debris.

Whilst the invention has been described above, it extends to any inventive combination of the features set out above or in the following description.

The invention may be performed in various ways and, by way of example only, three embodiments thereof will now be described with reference to the drawings, in which.

Figure 1:
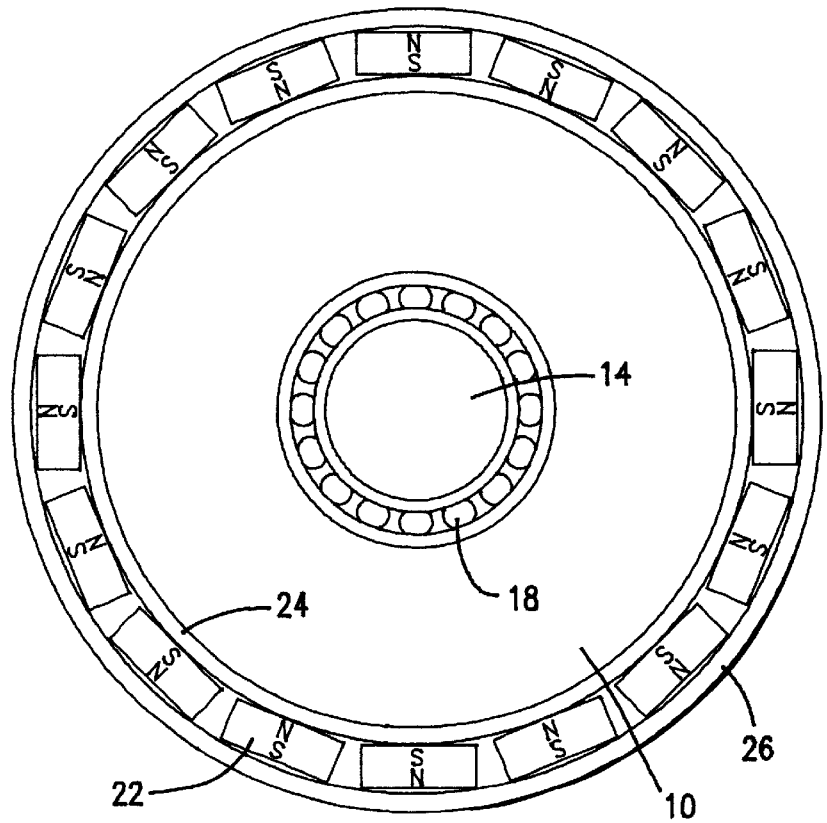
FIG. 1 is an end view on a first embodiment of transmission system in accordance with the invention.
Figure 1:
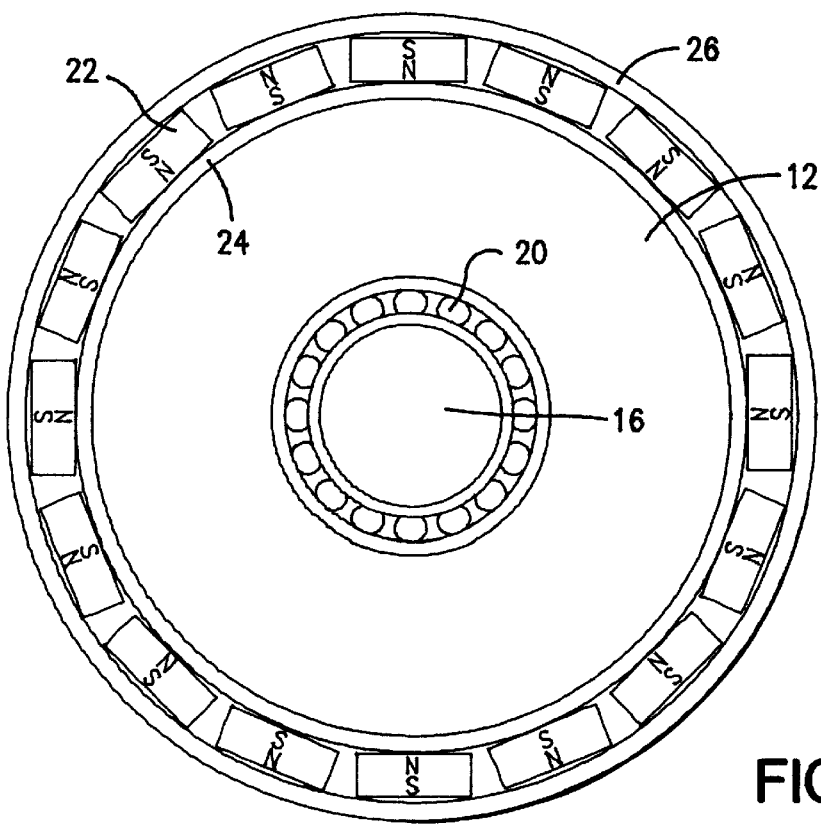

In FIG. 1, two drive discs 10, 12 are mounted on respective spaced parallel shafts 14, 16 by bearings 18, 20. Around the periphery of each disc 10, 12 is arranged a series of spaced magnets 22 of rectangular cross section, with their pole axes radial and adjacent magnets being of alternate polarity. Each disc includes an inner annular keeper 24 abutting the inner ends of the magnets and an outer annular keeper 26 encircling the outer ends of the magnets. In the equilibrium position the drive discs align so that the closest magnet on one disc faces a magnet of opposite polarity on the other disc, thus providing strong radial attraction, and zero net tangential force between the drive discs. As one disc rotates, the equilibrium position is momentarily disturbed so that the field lines between previously aligned magnets now have a tangential component which causes the other disc to rotate to re-establish equilibrium, until the next pair of magnets of opposite polarity are brought into alignment. Thus the system provides a form of magnetic gearing with high rigidity and minimal backlash, with the gear ratio determined by the number of magnets of each drive disc.

Figure 2:
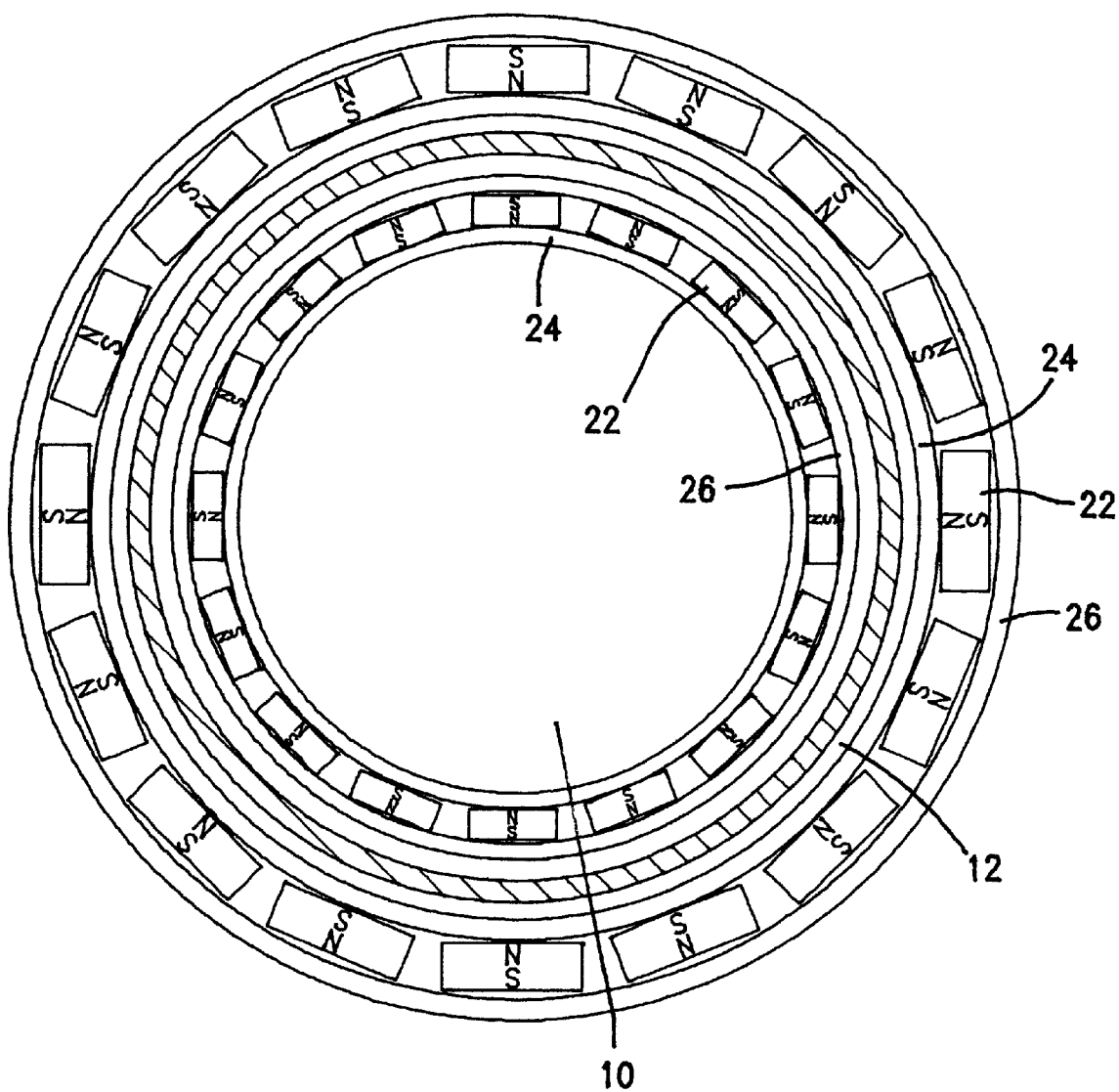
FIG. 2 is an end view on a second embodiment of transmission system in accordance with the invention.

The embodiment of FIG. 2 employs similar components and so these are given the same reference numerals and will not be described again in detail. In the embodiment of FIG. 2, the drive discs 10, 12 are disposed concentrically, one within the other, with the rotary axes of the shafts 14 and 16 parallel. Here the drive discs 10 and 12 rotate with each other, unless the torque transmitted overcomes the magnetic coupling force, and so the drive ratio is 1:1.

In these examples, the gearing is contactless, experiences little or no cogging, provides a smooth drive, and is capable of transmitting significant amounts of torque. If greater torque capabilities are required, further co-operating drive discs may be located on the shafts, to provide a stacked arrangement.

Compared to couplings which require machining and magnetisation or electromagnets these embodiments which use discrete magnets in a supporting frame result in cheaper assembly, without placing undue restrictions on manufacturing size. Furthermore we have found that, by arranging the discrete magnets to have alternate polarity as shown in FIGS. 1 and 2, i.e. with alternate N-S faces around the periphery of the concentric gear, the coupling rigidity is greatly enhanced. This is because of the abrupt termination of the magnetic poles at the edges of the magnets. By comparison, conventional single piece multiple magnets would produce a "sloppy" non-rigid coupling because it is impossible to terminate the poles abruptly in a homogenous material.

It should be emphasized that the magnets may instead be arranged to have the same polarity, i.e. with all N (or S) faces on one drive member and all S (or N) faces on the other. Although this would not give as good rigidity this could be useful where an odd number of magnets are used, or where only a few are used, or where only low coupling torque or low "break out" is required.

Figure 3:
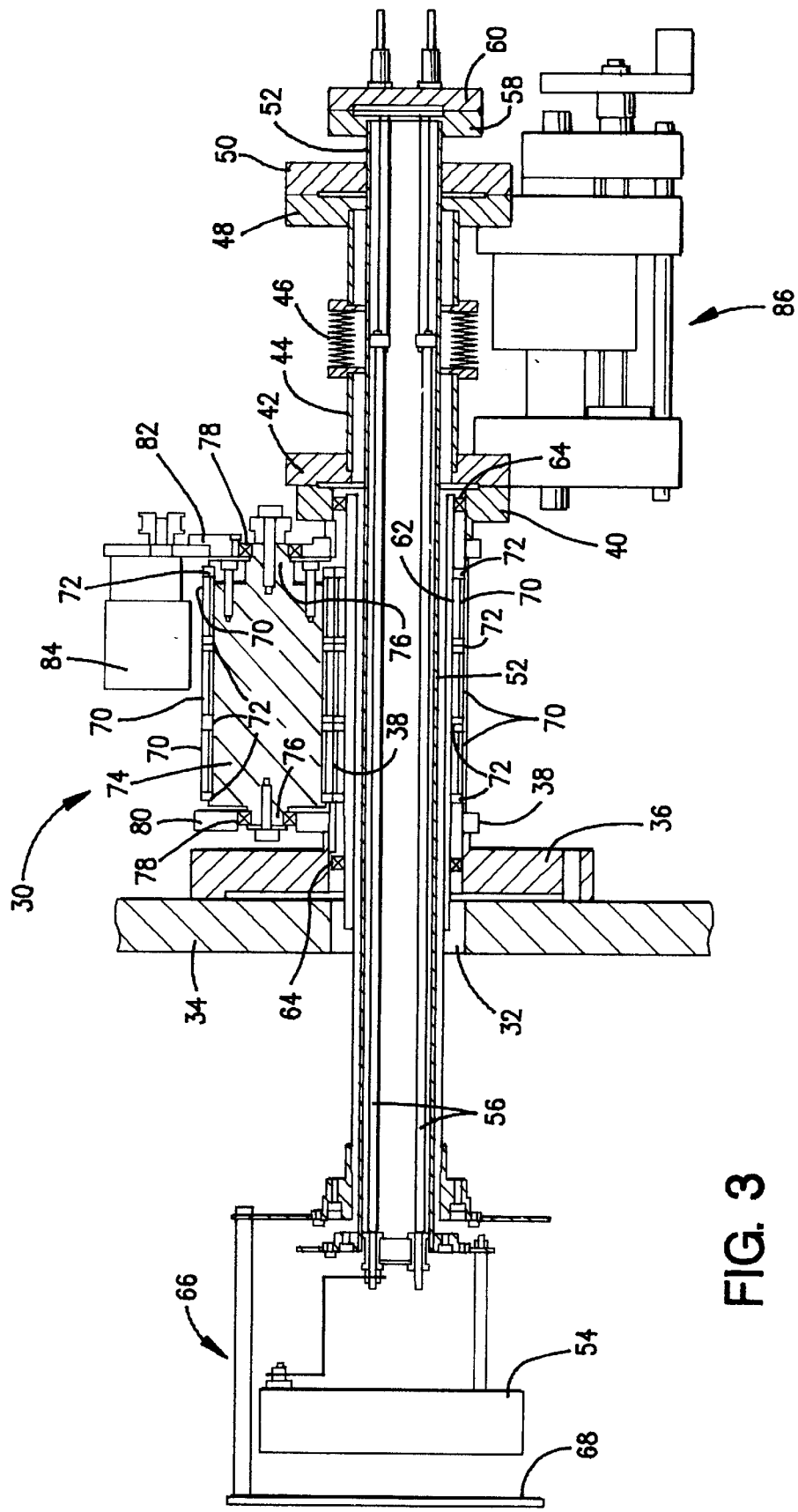
FIG. 3 is a longitudinal sectional view through a third embodiment of transmission system in accordance with the invention.

Referring now to FIG. 3, the third embodiment of this invention comprises a mechanism for heating semiconductor substrates, during thin film deposition.

Thin film deposition is a process used in the manufacture or research of semiconductor electronic devices, optical components, magnetic storage devices or any other technology requiring controlled growth. During the process materials are sputtered, evaporated or injected as gasses towards a heated substrate contained in a vacuum. It is often critical that the vacuum is an extremely low pressure. This requires process instrumentation to be of all metal construction, with the ability to tolerate temperatures of 250° C. (needed to accelerate outgassing process).

In order to permit uniform thickness of the deposited films, the heated substrate should be rotated.

The mechanism 30 is designed to be sealingly coupled to an access aperture 32 in the wall 34 of a vacuum vessel by means of a main flange 36. The main flange 36 is sealingly coupled to a non-ferrous thin metal membrane 38 which is connected to its other end to a flange 40 defining an access port.

In a basic design, a service entry flange could be sealingly secured to the flange 40 and carry an elongate support projecting into the vacuum vessel, but in this particular embodiment an optical Z shift module 86 is illustrated. The flange 40 is sealingly connected to a further flange 42 itself sealingly coupled to a tube 44 which incorporates a bellows arrangement 46 so that the effective length of the tube 44 may be increased and decreased. At its other end, the tube 44 is connected to a flange 48 which is sealingly coupled to a flange 50 having a bore in which a stiff tube 52 is sealed.

The stiff tube 52 extends through the bore of the extendable/contractible tube 44, and the bore of the membrane 38 to project into the vacuum vessel. At its inner end, the stiff tube 52 carries a heating module 54. The stiff tube 52 has a substantially larger bore than conventional vacuum feedthrough arrangements and allows high current leads 56 and other services such as multiple thermocouples, diagnostics, water cooling pipes and differential pumping (not shown) to be passed through the stiff tube 52. The outer end of the stiff tube 52 carries a flange 58 which is sealingly connected to a service entry flange 60. The membrane 38, extendable/contractible tube 44 and the outer end of the stiff tube 52 together isolate the interior from the exterior.

A torque tube 62 is mounted concentrically within the membrane 38 by means of bearing arrangements 64 running in bores in the main flange 36 and a further flange 40. The torque tube extends inwardly beyond the main flange 36 to project into the interior of the vacuum vessel. At its inner end it is connected to a substrate support cradle 66 which holds a substrate 68 and in operation spins the substrate in front of the heater module 54. The torque tube 62 carries on its outer periphery one or more annular series of discrete magnets 70 of rectangular cross section. The magnets are kept in place by inner keepers 72 and the number of magnets, their spacing and alternate polarity may typically be similar to that shown in FIG. 1. The size and location of the magnets is such that they fit closely within the non-magnetic membrane 38 so that the torque tube 62 may spin freely. An outer drive rotor 74 comprises three similar annular series of magnets 70 held in place by keepers 72. Depending on the drive ratio required, the number, spacing and polarity of the magnets may be typically similar to that shown in FIG. 1. The drive rotor 74 is mounted for rotation about an axis parallel to the rotational axis of the torque tube 62 by means of two small diameter stub axles 76 which are received in bearings 78 supported at one end by a bracket 80 connected to the main flange and at the other end by a bracket 82 connected to the further flange 40, so that the drive rotor is in magnetic torque-transmitting relationship with the magnets on the torque tube 62. The drive rotor 74 is driven by means of a motor 84 and a drive belt (not shown) and pulley system.

Thus the substrate 68 may be spun in front of the heater module 54 at a speed determined by the rotational speed of the motor 84 and the drive ratio between the drive member and the torque tube.

The optional Z axis module 86 is connected between the flange 42 and flange 48 to vary the effective length of the extendable/contractible tube 44 and thus to vary the longitudinal or Z axis displacement between the heater module 54 and the rear of the substrate 68. The Z axis module may be driven by means of a motor or a hand wheel.

One of the important features of the arrangement is that the internal diameter of the stiff tube 52 is substantially larger than those of conventional arrangements. In conventional concentric arrangements, the flange 40 has to be of much smaller diameter because it must be sufficiently small for the outer concentric drive member to pass over it for servicing. This constraint means that the diameter of the inner stiff tube is much smaller.

The large bore access through the rotating member allows high current leads, multiple thermocouples, diagnostics, water cooling pipe, differential piping to pass through the tube, and even the transverse movement of items within the stiff tube to be achieved. In a typical arrangement according to the invention, the access port may have a diameter of 50 mm or far larger. Conventional concentric systems are limited to about 15 mm diameter.

Using larger bore access flanges allows the heater support structure to match the demand for ever increasing substrate size. The ratio of the driver to driven magnet arrays may be changed to match spin speed requirements and to reduce instrument bulk. The eccentric coupling requires only one set of large torque tube bearings (which are expensive), since the drive rotor may be spun on conventional small bearings.

We claim:

1. A rotary feedthrough arrangement for providing rotational drive via an aperture in the wall of an enclosure which is sealed in use, said arrangement including:

a connector member for being sealingly attached to said aperture;

a non-ferrous membrane element of generally tubular form and sealingly connected at one end region to said connector member;

a further connector member sealingly connected to another end region of said membrane element;

an elongate rotary tubular element disposed at least partially within said tubular membrane element and rotatable with respect thereto;

a magnetic element fixedly associated with said elongate rotary tubular element and comprising one or more circumferential series of discrete magnet elements; and an external drive member disposed outside said membrane element and mounted for rotation about an axis generally parallel to but spaced from the rotary axis of said rotary tubular element and comprising one or more circumferential series of discrete magnet elements in torque-transmitting relationship with the respective magnet elements on the rotary tubular element, wherein said further connector member has an external diameter greater than that of said external drive member.

2. A rotary feedthrough arrangement according to claim 1, wherein each of said circumferential series of discrete magnet elements comprises two generally circular inner and outer keeper elements with said magnet elements disposed between said keeper elements.

3. A rotary feedthrough arrangement according to claim 1, wherein the pole axes of the magnet elements on the rotary tubular element and on the drive member are radially disposed with regard to the respective associated rotational axes thereof.

4. A rotary feedthrough arrangement according to claim 1, wherein successive magnet elements in each series have opposite polarity.

5. A rotary feedthrough arrangement according to claim 1, including an elongate relatively fixed member extending at least partly through said rotary tubular element to project in use into said enclosure.

6. A rotary feedthrough arrangement according to claim 1, wherein said membrane element is at least partially cylindrical, closely surrounding said rotary tubular element with clearance.

7. A rotary feedthrough arrangement according to claim 1, wherein at least one of said magnetic element associated with said tubular element and said external drive member is made up of two or more annular series of discrete spaced magnets.

8. A rotary feedthrough arrangement according to claim 1, wherein the numbers of the magnets on said magnetic element and said external drive member provide a drive ratio of 1:1.

9. A rotary feedthrough arrangement according to claim 1, wherein the external drive member is rotatably attached to a bracket connected to or forming part of the membrane element.

10. A rotary feedthrough arrangement according to claim 1, wherein the external drive member is mounted for rotation by bearing assemblies of diameter substantially smaller than that of the drive member.

* * * * *